United States Patent
Li et al.

(10) Patent No.: US 7,598,108 B2
(45) Date of Patent: Oct. 6, 2009

(54) GALLIUM NITRIDE-ON-SILICON INTERFACE USING MULTIPLE ALUMINUM COMPOUND BUFFER LAYERS

(75) Inventors: Tingkai Li, Vancouver, WA (US); Douglas J. Tweet, Camas, WA (US); Jer-Shen Maa, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 25 days.

(21) Appl. No.: 11/825,427

(22) Filed: Jul. 6, 2007

(65) Prior Publication Data

US 2009/0008647 A1  Jan. 8, 2009

(51) Int. Cl.
*H01L 21/00* (2006.01)

(52) U.S. Cl. .................. 438/48; 438/172; 438/22; 257/103; 257/194; 257/E21.121; 257/E21.126

(58) Field of Classification Search ............ 438/21, 438/46, 479, 688; 257/E21.121, E21.126
See application file for complete search history.

(56) References Cited

U.S. PATENT DOCUMENTS

| | | | | |
|---|---|---|---|---|
| 4,865,830 A | * | 9/1989 | Klabunde et al. | 423/412 |
| 5,679,965 A | * | 10/1997 | Schetzina | 257/103 |
| 6,391,748 B1 | * | 5/2002 | Temkin et al. | 438/478 |
| 6,649,287 B2 | | 11/2003 | Weeks et al. | 428/698 |
| 6,818,061 B2 | | 11/2004 | Peczalski et al. | 117/104 |
| 2005/0067935 A1 | * | 3/2005 | Lee et al. | 313/309 |
| 2005/0142876 A1 | * | 6/2005 | Katona et al. | 438/688 |
| 2006/0073621 A1 | * | 4/2006 | Kneissel et al. | 438/21 |
| 2006/0244011 A1 | * | 11/2006 | Saxler | 257/194 |
| 2006/0270087 A1 | * | 11/2006 | Imer et al. | 438/46 |
| 2006/0286782 A1 | * | 12/2006 | Gaska et al. | 438/483 |
| 2007/0197004 A1 | * | 8/2007 | Dadgar et al. | 438/479 |

OTHER PUBLICATIONS

D. Zubia and S.D. Hersee, J. Appl. Phys., 85, 6492 (2001).

* cited by examiner

*Primary Examiner*—Hoai V Pham
*Assistant Examiner*—Eric W Jones
(74) *Attorney, Agent, or Firm*—Law Office of Gerald Maliszewski; Gerald Maliszewski

(57) ABSTRACT

A thermal expansion interface between silicon (Si) and gallium nitride (GaN) films using multiple buffer layers of aluminum compounds has been provided, along with an associated fabrication method. The method provides a (111) Si substrate and deposits a first layer of AlN overlying the substrate by heating the substrate to a relatively high temperature of 1000 to 1200° C. A second layer of AlN is deposited overlying the first layer of AlN at a lower temperature of 500 to 800° C. A third layer of AlN is deposited overlying the second layer of AlN by heating the substrate to the higher temperature range. Then, a grading $Al_{1-x}Ga_xN$ layer is formed overlying the third layer of AlN, where $0<X<1$, followed by a fixed composition $Al_{1-x}Ga_xN$ layer overlying the first grading $Al_{1-x}Ga_xN$ layer. An epitaxial GaN layer can then be grown overlying the fixed composition $Al_{1-x}Ga_xN$ layer.

16 Claims, 6 Drawing Sheets

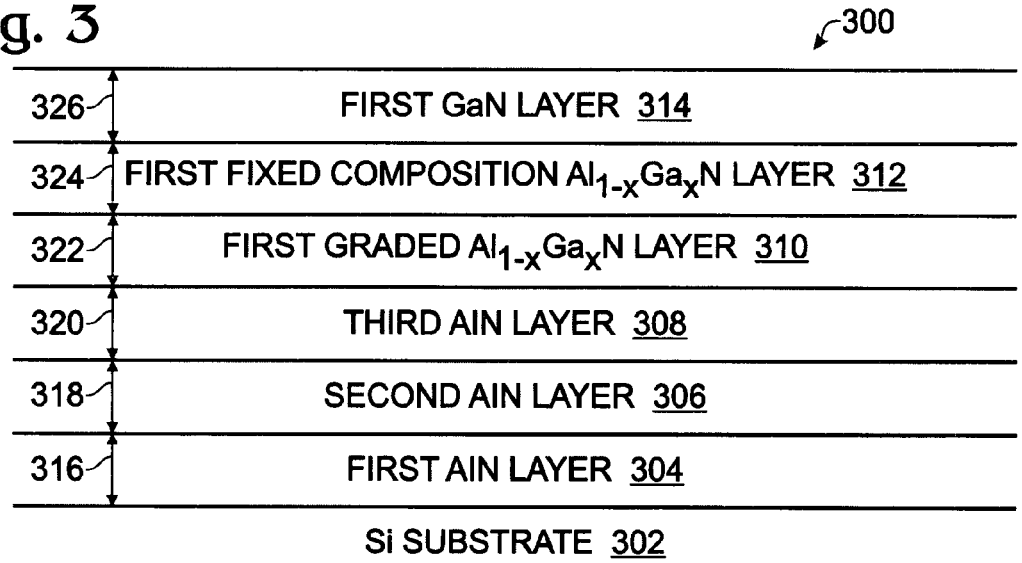
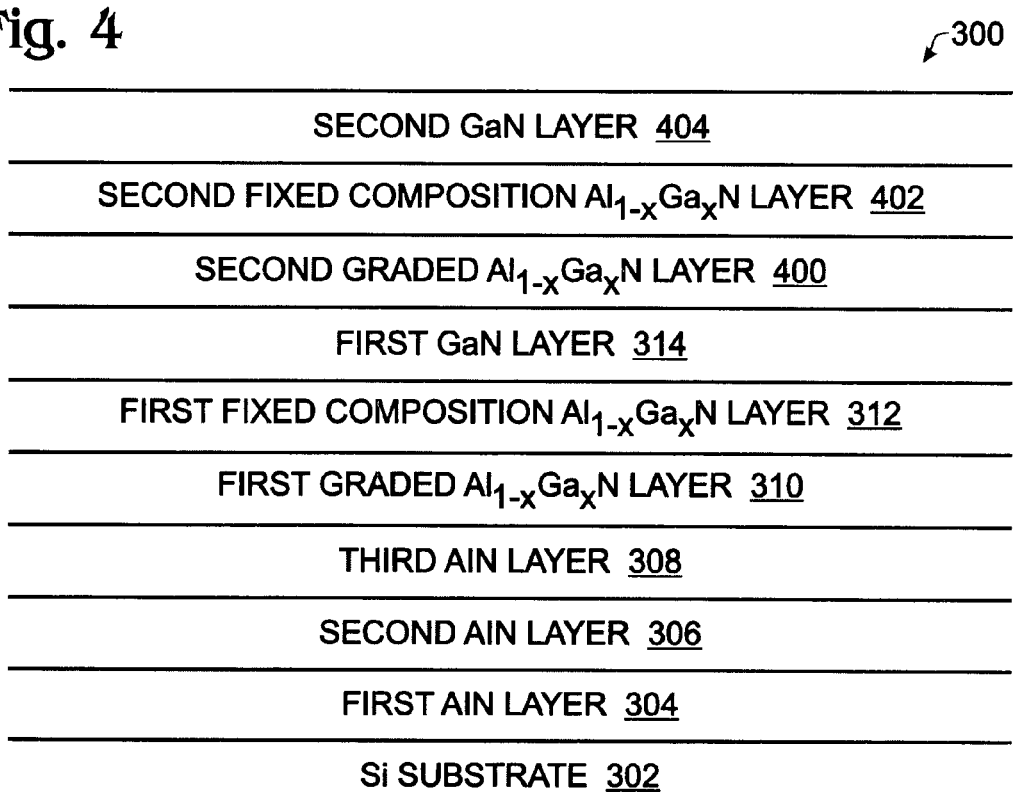

GALLIUM NITRIDE-ON-SILICON INTERFACE USING MULTIPLE ALUMINUM COMPOUND BUFFER LAYERS

BACKGROUND OF THE INVENTION

1. Field of the Invention

This invention generally relates to integrated circuit (IC) fabrication and, more particularly to a gallium nitride-on-silicon interface that uses multiple buffer layers of aluminum compounds, and an associated fabrication process.

2. Description of the Related Art

Gallium nitride (GaN) is a Group III/Group V compound semiconductor material with wide bandgap (3.4 eV), which has optoelectronic, as well as other applications. Like other Group III nitrides, GaN has a low sensitivity to ionizing radiation, and so, is useful in solar cells. GaN is also useful in the fabrication of blue light-emitting diodes (LEDs) and lasers. Unlike previous indirect bandgap devices (e.g., silicon carbide), GaN LEDs are bright enough for daylight applications. GaN devices also have application in high power and high frequency devices, such as power amplifiers.

GaN LEDs and GaN-based devices are conventionally fabricated using a metalorganic chemical vapor deposition (MOCVD) for deposition on a sapphire substrate. Zinc oxide and silicon carbide (SiC) substrate are also used due to their relatively small lattice constant mismatch. However, these substrates are expensive to make, and their small size also drives fabrication costs. For example, the state-of-the-art sapphire wafer size is relatively small when compared to silicon wafers. The low thermal and electrical conductivity constraints associated with sapphire make device fabrication more difficult. For example, all contacts must be made from the top side. This contact configuration complicates contact and package schemes, resulting in a spreading-resistance penalty and increased operating voltages. The poor thermal conductivity of sapphire [0.349 (W/cm-° C.)], as compared with that of Si [1.49 (W/cm-° C.)] or SiC, also prevents efficient dissipation of heat generated by high-current devices, such as laser diodes and high-power transistors, consequently inhibiting device performance.

To minimize costs, it would be desirable to integrate GaN device fabrication into more conventional Si-based IC processes, which has the added cost benefit of using large-sized (Si) wafers. Si substrates are of particular interest because they are less expansive and they permit the integration of GaN-based photonics with well-established Si-based electronics. The cost of a GaN heterojunction field-effect transistor (HFET) for high frequency and high power application could be reduced significantly by replacing the expensive SiC substrates that are conventionally used.

FIG. 1 is a graph depicting the lattice constants of GaN, Si, SiC, AlN and sapphire (prior art). There are two fundamental problems associated with GaN-on-Si device technology. First, there is a lattice mismatch between Si and GaN. The difference in lattice constants between GaN and Si, as shown in the figure, results in a high density of defects from the generation of threading dislocations. This problem is addressed by using a buffer layer of AlN, InGaN, AlGaN, or the like, prior to the growth of GaN. The buffer layer provides a transition region between the GaN and Si.

FIG. 2 is a graph depicting the thermal expansion coefficients (TECs) of GaN, Si, SiC, AlN, and sapphire (prior art). An additional and more serious problem exists with the use of Si, as there is also a thermal mismatch between Si and GaN. GaN-on-sapphire experiences a compressive stress upon cooling. Therefore, film cracking is not as serious of an issue as GaN-on-Si, which is under tensile stress upon cooling, causing the film to crack when the film is cooled down from the high deposition temperature. The thermal expansion coefficient mismatch between GaN and Si is about 54%.

The film cracking problem has been analyzed in depth by various groups, and several methods have been tested and achieve different degrees of success. The methods used to grow crack-free layers can be divided into two groups. The first method uses a modified buffer layer scheme. The second method uses an in-situ silicon nitride masking step. The modified buffer layer schemes include the use of a grading AlGaN buffer layer, AlN interlayers, and AlN/GaN or AlGaN/GaN-based superlattices.

Although the lattice buffer layer may absorb part of the thermal mismatch, the necessity of using temperatures higher than 1000° C. during epi GaN growth and other device fabrication processes may cause wafer deformation. The wafer deformation can be reduced with a very slow rate of heating and cooling during wafer processing, but this adds additional cost to the process, and doesn't completely solve the thermal stress and wafer deformation issues.

It is generally understood that a buffer layer may reduce the magnitude of the tensile growth stress and, therefore, the total accumulated stress. However, from FIG. 2 it can be seen that there is still a significant difference in the TEC of these materials, as compared with GaN. Therefore, thermal stress remains a major contributor to the final film stress.

D. Zubia et al. describe an approach to the heteroepitaxy of lattice mismatched semiconductors, which is called nanoheteroepitaxy. The theory developed in their research shows that the 3D stress relief mechanisms that are active when an epilayer is nucleated as an array of nanoscale islands on a compliant patterned substrate significantly reduces the strain energy in the epilayer and extends the critical thickness of a film dramatically.

It would be advantageous if the thermal mismatch problem associated with GaN-on-Si device technology could be practically eliminated by using aluminum compound buffer layers as a thermal interface interposed between the GaN and Si layers.

It would be advantageous if the aluminum compound buffer layer approach to a GaN-on-Si interface could be augmented with the use of nanoscale lateral epitaxial overgrowth (NLEO) GaN, to further reduce the defect density.

SUMMARY OF THE INVENTION

As noted above, the current best large-area GaN films are grown on sapphire substrates. But, state-of-the-art sapphire substrate size is relatively small and expensive. Further, the thermal conductivity of sapphire is low [0.349 (W/cm-° C.)], which limits their use in high power and high density device applications. The high cost of large sapphire substrates makes GaN-on-silicon substrates the best alternative. Si substrates have a higher thermal conductivity [1.49 (W/cm-° C.)], which is four times higher than sapphire.

The lattice constants of GaN, Si, and sapphire are about 0.32 nm, 0.38 nm, and 0.48 nm, respectively. Thus, the lattice mismatch between GaN and sapphire is more severe than that between GaN and silicon. However, the thermal expansion coefficients for GaN, Si, and sapphire are about $5.6 \times 10^{-6}$/° K., $3.7 \times 10^{-6}$/° K., and $7.4 \times 10^{-6}$/° K., respectively. Thus, the thermal expansion mismatch between GaN and Si is more severe than that between GaN and sapphire. To avoid the lattice mismatch and thermal mismatch between GaN and Si, a nanoscale lateral epitaxial overgrowth process with aluminum compound buffer layers may be used to improve the GaN film quality. In addition, a nanoheteroepitaxy lateral overgrowth technology may be combined with the aluminum compound buffer layers to make high quality thick GaN films on Si substrates.

Accordingly, a method is provided for forming a thermal expansion interface between S) and GaN films using multiple buffer layers of aluminum compounds. The method provides a (111) Si substrate and deposits a first layer of AlN overlying the substrate by heating the substrate to a relatively high temperature, within the range of 1000 to 1200° C. A second layer of AlN is deposited overlying the first layer of AlN by heating the substrate to a temperature within a lower temperature range of 500 to 800° C. A third layer of AlN is deposited overlying the second layer of AlN by heating the substrate to the higher temperature range. Then, a grading $Al_{1-x}Ga_xN$ layer is formed overlying the third layer of AlN, where $0<X<1$, followed by a fixed composition $Al_{1-x}Ga_xN$ layer overlying the first grading $Al_{1-x}Ga_xN$ layer. An epitaxial GaN layer can then be grown overlying the fixed composition $Al_{1-x}Ga_xN$ layer.

In some aspects, subsequent to growing the first epitaxial GaN layer, a second grading $Al_{1-x}Ga_xN$ layer is formed overlying the first epitaxial GaN layer, a second fixed composition $Al_{1-x}Ga_xN$ layer is formed overlying the second grading $Al_{1-x}Ga_xN$ layer, and a second epitaxial GaN layer is grown overlying the fixed composition $Al_{1-x}Ga_xN$ layer.

In another aspect, a patterned layer is formed overlying the second epitaxial GaN layer. The patterned layer is a hard mask, and may be anodized aluminum oxide (AAO) or block polymer for example. Then, a lateral nanoheteroepitaxy overgrowth (LNEO) process may be used to grow a third GaN layer overlying the patterned layer.

Additional details of the above-mentioned method and a GaN-on-Si multilayer thermal expansion interface, made from multiple buffer layers of Al compounds, are provided below.

BRIEF DESCRIPTION OF THE DRAWINGS

FIG. 3 is a partial cross-sectional view of a silicon (Si)-to-gallium nitride (GaN) thermal expansion interface with multiple aluminum compound buffer layers.

FIG. 4 is a partial cross-sectional view of a first variation of the GaN-to-Si interface of FIG. 3.

DETAILED DESCRIPTION

Figure 1:
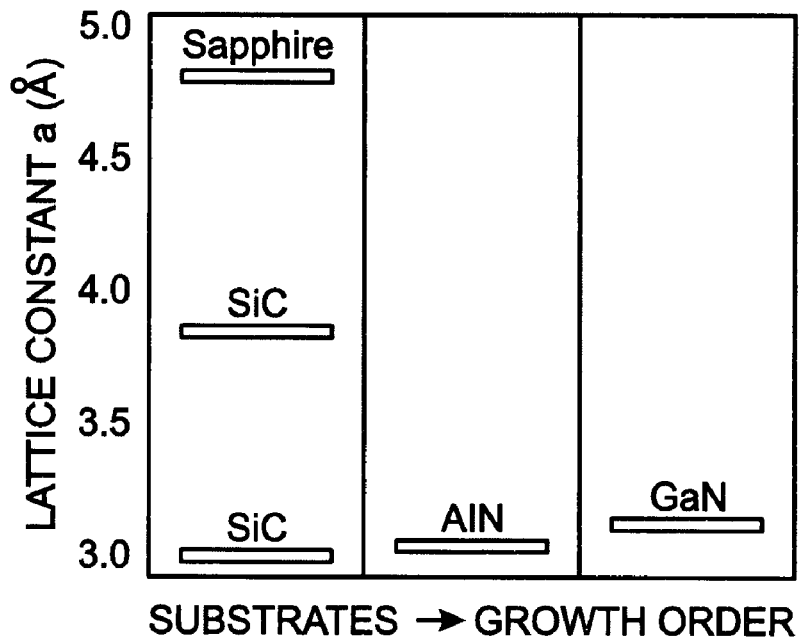
FIG. 1 is a graph depicting the lattice constants of GaN, Si, SiC, AlN and sapphire (prior art).
Figure 2:
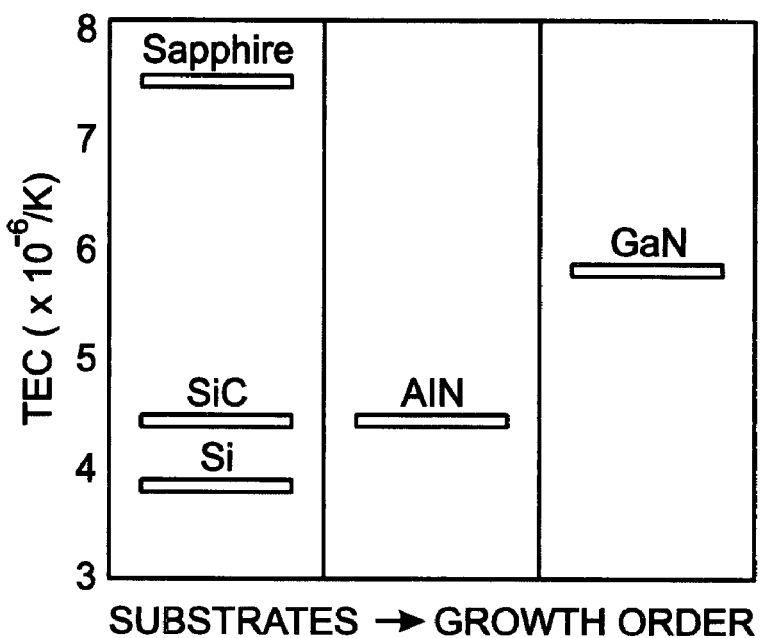
FIG. 2 is a graph depicting the thermal expansion coefficients (TECs) of GaN, Si, SiC, AlN, and sapphire (prior art).

FIG. 3 is a partial cross-sectional view of a silicon (Si)-to-gallium nitride (GaN) thermal expansion interface with multiple aluminum compound buffer layers. The interface 300 comprises a (111) Si substrate 302 and a first layer of AlN 304 overlying the substrate having a first density. A second layer of AlN 306 overlies the first layer of AlN having a second density, less than the first density. A third layer of AlN 308 overlies the second layer of AlN 306, having the first density. That is, third AlN layer 308 is denser than second layer 306. However, the density of the first layer 304 need not be identical to the density of the third layer 308. A first grading $Al_{1-x}Ga_xN$ layer 310 overlies the third layer of AlN 308, where $0<X<1$. A first fixed composition $Al_{1-x}Ga_xN$ layer 312 overlies the first grading $Al_{1-x}Ga_xN$ layer 310, where $0<X<1$. A first epitaxial GaN layer 314 overlies the first fixed composition $Al_{1-x}Ga_xN$ layer 312.

In one aspect, the first and second AlN layers 304 and 306 each have a thickness 316 and 318, respectively, in the range of 10 to 50 nanometers (nm). Note: thicknesses 316 and 318 need not be the same. The third AlN layer 308 has a thickness 320 in the range of 100 to 500 nm. The first grading and first fixed composition $Al_{1-x}Ga_xN$ layers 310 and 312 each have a thickness 322 and 324, respectively, in the range of 10 to 500 nm. Note: thicknesses 322 and 324 need not necessarily be the same. In this aspect, the first epitaxial GaN layer 314 has a thickness 326 in the range of 500 to 3000 nm.

FIG. 4 is a partial cross-sectional view of a first variation of the GaN-to-Si interface of FIG. 3. The variation of FIG. 4 includes all the layers described in FIG. 3, which will not be repeated here in the interest of brevity. In addition, a second grading $Al_{1-x}Ga_xN$ layer 400 overlies the first epitaxial GaN layer 314. A second fixed composition $Al_{1-x}Ga_xN$ layer 402 overlies the second grading $Al_{1-x}Ga_xN$ layer. A second epitaxial GaN layer 404 overlying the second fixed composition $Al_{1-x}Ga_xN$ layer 402. Although not specifically shown, the additional $Al_{1-x}Ga_xN$ layers shown in FIG. 4 typically have thicknesses in the same range as the ones described in FIG. 3. Likewise, the thickness of the second GaN layer 404 is typically within range of the first GaN layer.

Figure 5:
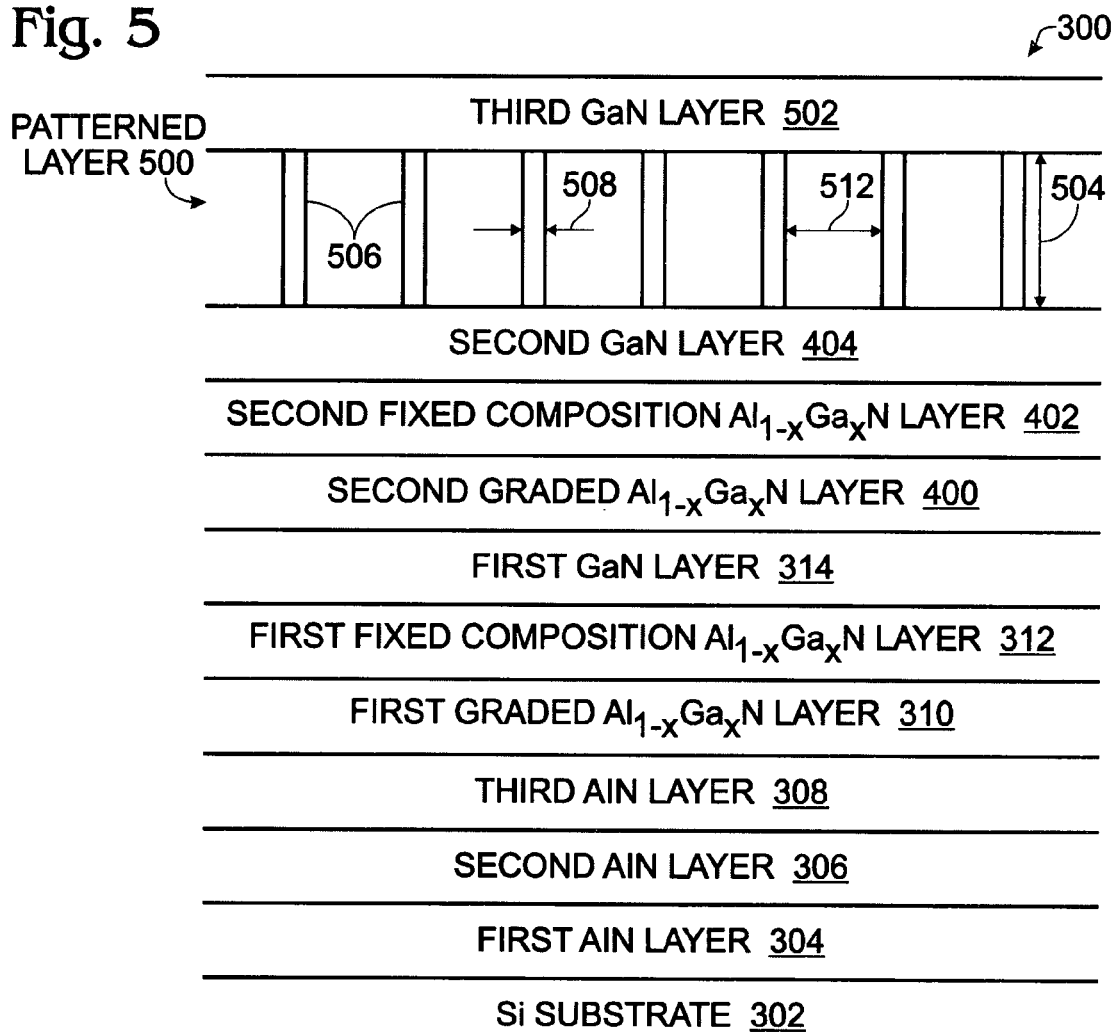
FIG. 5 is a partial cross-sectional view of a second variation of the GaN-to-Si interface of FIG. 3.

FIG. 5 is a partial cross-sectional view of a second variation of the GaN-to-Si interface of FIG. 3. The variation of FIG. 5 includes all the layers described in FIG. 4, which will not be repeated here in the interest of brevity. A patterned layer 500 overlies the second epitaxial GaN layer 404. The patterned layer 500 may be anodized aluminum oxide (AAO) or block polymer for example. If the patterned layer 500 is AAO, the film material may be AlN, an AlN/grading AlGaN ($Al_{1-x}Ga_xN$ ($0<X<1$)) stack, an AlN/AlGaN/GaN stack, or Al. A third GaN layer 502 overlies the patterned layer 502. Advantageously, the third GaN layer 502 may be grown using a lateral nanoheteroepitaxy overgrowth (LNEO) process. Alternately, an epitaxial growth process may be used.

The patterned layer 500 has a thickness 504 in the range of 10 to 500 nm, and pattern openings 506 with a diameter 508 in the range between 5 and 100 nm. The pattern openings 506 have a depth that extends through the patterned layer thickness 504, and a distance 512 between openings in the range between 100 nm and 2 micrometers (μm).

Functional Description

The detailed process conditions for fabricating the GaN-on-Si interface shown in FIGS. 3 through 5 are as follows.

1. Pretreatments for GaN growth on Si substrates

A. For high quality epi GaN growth on Si substrates, the process starts from reactor cleaning and conditioning. A long bake-out at 1050° C. for 30 minutes in hydrogen is used between each GaN deposition run to remove the Ga and GaN from the susceptor chamber and lines. Because Si reacts strongly with both Ga and nitrogen, the formation of amorphous SixNy and segregated Ga domains may occur, which results in defects and formation of a very poor quality GaN. Interdiffusion of Ga into the substrate, and Si into GaN layer also must be avoided.

B. The Si(111) substrates may be chemically cleaned in H2SO4:H2O2:H2O (3:1:1) and BOE HF(20:1) before being loaded into the reactor to remove native oxide from Si substrate surface.

C. The Si(111) substrates may also be in situ cleaned at 1050° C., for 30 minutes, in a hydrogen atmosphere to further remove native oxide from Si substrate surface.

2. AlN buffer layer deposition

As noted above, Si reacts strongly with both Ga and nitrogen, leading to the formation of amorphous SixNy and segregated Ga domains, which results in defects and the formation of a very poor quality GaN. Interdiffusion of Ga into substrate and Si into GaN layer also must be avoided. For this reason, stable AlN buffer layers are required. AlN is very stable, but high quality AlN requires extremely high growth temperatures. On the other hand, the thermal expansion coefficient of AlN is between GaN and Si substrate, which acts to reduce the thermal mismatch between GaN and the Si substrate.

In order to grow high quality AlN on Si substrates, extremely high growth temperatures are required. AlN has a 19% lattice mismatch and about 15% thermal mismatch with Si(111), which generates a tensile stress of about 6.269 GPa on AlN. However, even an AlN thin film with a very small thickness of about 30 nm cracks as high temperature due to the tensile stress. To address this issue, a high temperature (HT)-AlN/low temperature (LT)-AlN/HT-AlN structure has been developed. Using the HT-AlN/LT-AlN/HT-AlN structure, crack free AlN films can be obtained.

A. The first layer of HT-AlN film may be formed with a thickness of about 10-50 nm at a deposition temperature of 1000-1200° C., with III/V molar ratio from 500 to 4000, depending upon the metalorganic chemical vapor deposition (MOCVD) system used, to form a layer for preventing the reaction of Si with both Ga and nitrogen. However, there are likely to be many defects and cracks in the first HT-AlN layer.

Figure 6:
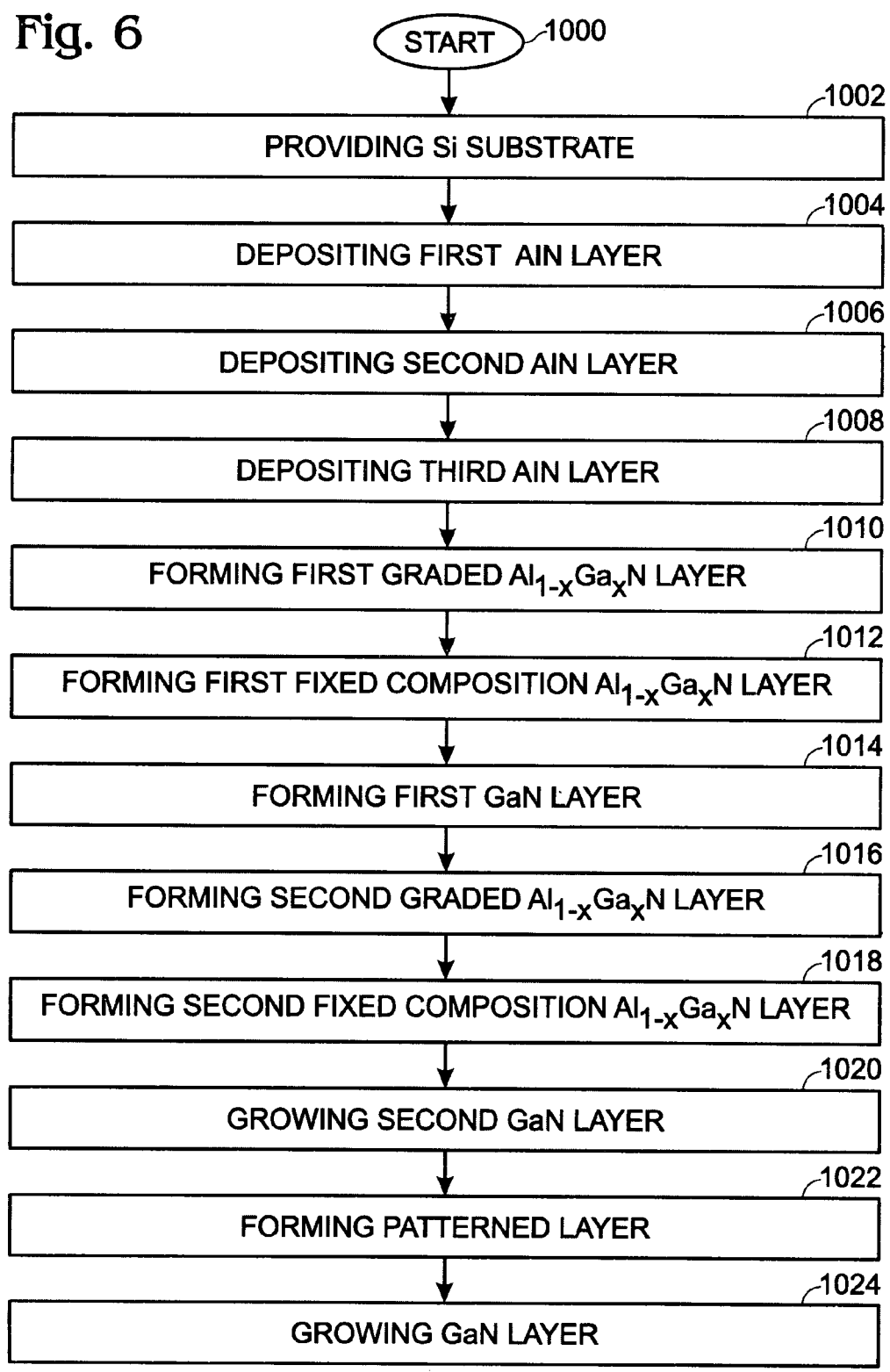
FIG. 6 is a flowchart illustrating a method for forming a thermal expansion interface between Si and GaN films using multiple buffer layers of aluminum compounds.

B. The second layer of LT-AlN film may be formed with thickness of about 10-50 nm at a deposition temperature of 500-800° C., with III/V molar ratio from 500 to 4000, depending on the MOCVD system, to form a nucleation layer for growth of another HT-AlN layer and also to stop the extension of cracks and defects into the top HT-AlN layer. Experimental results have proven that the use of multi-layered structures can stop or reduce the cracks and defects formed in the top layer AlN and GaN films, as shown in FIG. 6.

C. The third layer of HT-AlN film has a thickness of about 100-500 nm or higher, and is deposited at a temperature of about 1000-1200° C., with III/V ratio from 500 to 4000, depending upon the MOCVD system, to form a high quality AlN with lower defect density for further growth of GaN films.

Figure 7:
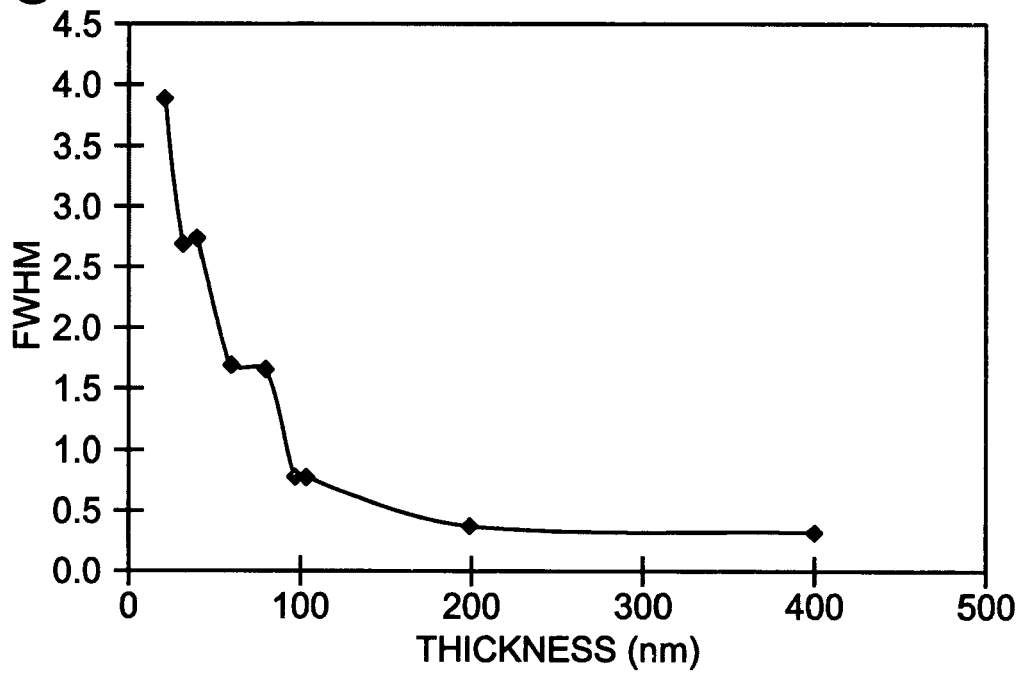
FIG. 7 is a graph depicting an X-ray diffraction (XRD) mosaic full width at half maximum (FWHM) (degrees) referenced to AlN thickness.

FIG. 7 is a graph depicting an X-ray diffraction (XRD) mosaic full width at half maximum (FWHM) (degrees) referenced to AlN thickness. From the figure it can be seen that the film qualities of AlN improve with increased AlN thickness, and the best film quality is obtained when the thickness reaches critical thickness values for various sizes of wafers.

Figure 8:
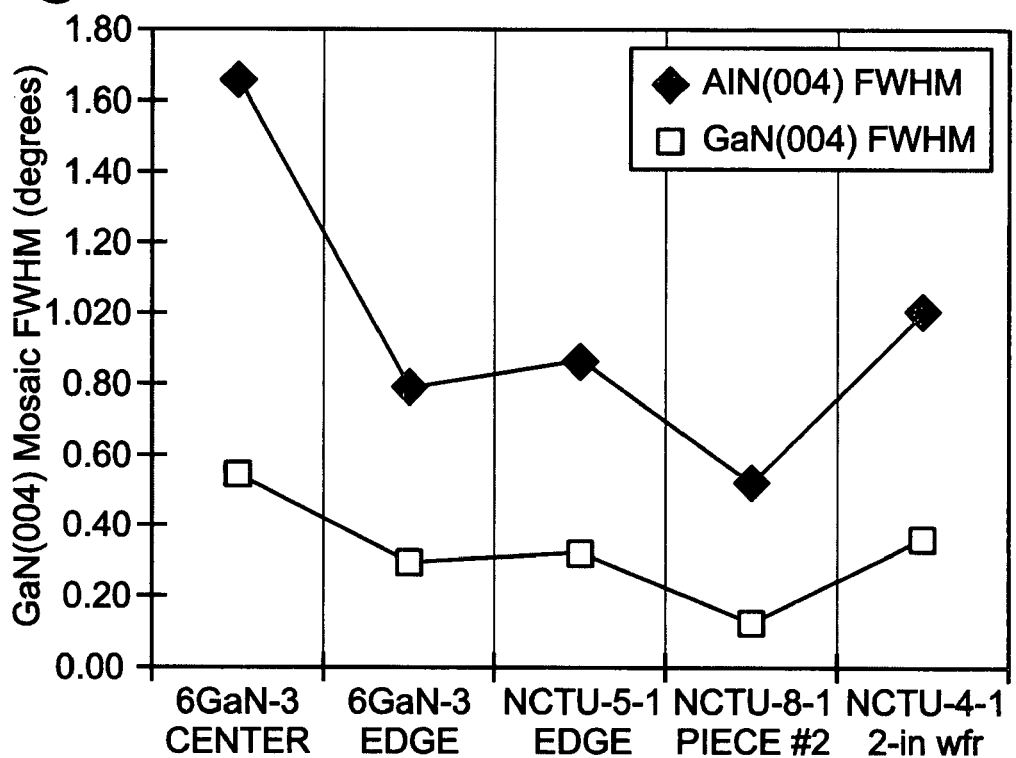
FIGS. 8 and 9 are graphs depicting the relationship between GaN film quality and AlN film quality.
Figure 9:
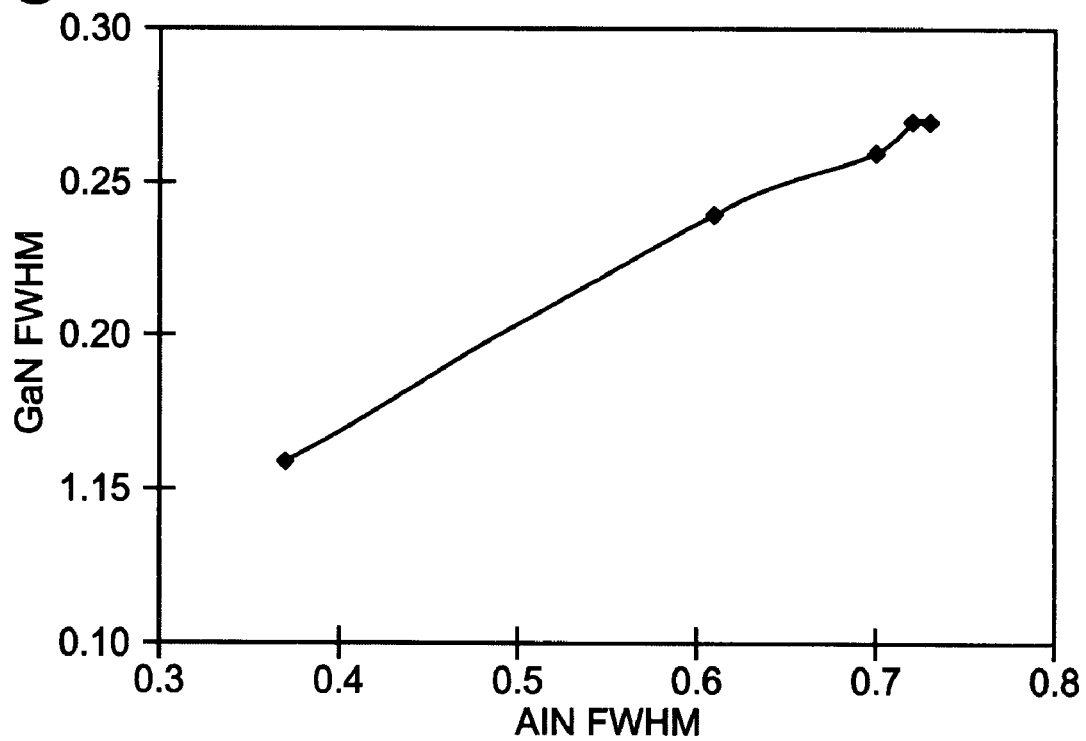

FIGS. 8 and 9 are graphs depicting the relationship between GaN film quality and AlN film quality. FIG. 8 depicts XRD data of various GaN/AlN/Si wafers. FIG. 9 depicts the relationship between AlN and GaN FWHM data with various GaN/AlN/Si wafers. The graphs show that high quality GaN films are only grown from high quality AlN films. Therefore, control of the third layer thickness, and the making of high quality AlN films are very important in obtaining high quality GaN films on Si substrates.

3. A grading or graded composition $Al_{1-x}Ga_xN$ buffer layer is deposited, where the Ga composition (X) may change from 0 to 1 as the layer thickness increases. A grading $Al_{1-x}Ga_xN$ buffer layer can transfer the lattice mismatch and thermal mismatch from AlN to GaN, which may reduce the stresses in the top layer of GaN film. The grading $Al_{1-x}Ga_xN$ buffer layer may have a thickness of about 10-500 nm, and is deposited at a temperature of about 1000-1200° C., with III/V ratio from 500 to 4000, depending upon the MOCVD system.

4. A fixed composition $Al_{1-x}Ga_xN$ buffer layer is deposited, where 0<X<1. The fixed $Al_{1-x}Ga_xN$ buffer layer has a thickness of about 10-500 nm, and is deposited at a temperature of about 1000-1200° C., with a III/V ratio from 500 to 4000, depending upon the MOCVD system. Using AlN buffer layers, the lattice mismatch between AlN and GaN can generate compressive stress on the GaN film, since the lattice constants of AlN are a little smaller than those of GaN. Also, the thermal expansion coefficient for AlN is a little higher than that of GaN at high temperatures. The thermal mismatch between GaN and Si can generate tensile stress on the GaN film, since the thermal expansion coefficient of GaN is higher than that of Si.

In order to make crack-free GaN films, a high compressive stress may be generated on the GaN to compensate for the thermal stress. From the theory and formula, the stress on GaN can be calculated, assuming a perfect epitaxial (epi) GaN growth on AlN. First, it is assumed that the GaN "a" direction [100] aligns with the AlN "a" direction, such that $a_{GaN} \sim a_{AlN}$. Then, the strain parallel to the surface: $\epsilon = 2(a_{GaN} - a_{AlN})/(a_{GaN} + a_{AlN})$, and $\sigma = E\epsilon$ can be calculated for GaN on AlN at different temperatures. At room temperature, the compressive stress on GaN is $\sigma_{GaN} = 11.8$ GPa, which is large enough to compensate for the tensile stress from thermal mismatch. However, from in situ stress measurements, the maximum compressive stress which is generated from the lattice mismatch is only about 2 Gpa. The reasons are as follows: 1) if the AlN film quality is too poor of a quality, the perfect GaN lattice cannot exactly match the AlN lattice during the growth, and the compressive stresses are released. 2) The lattice mismatch between AlN and GaN is too large. That is, the perfect GaN lattice cannot exactly match the AlN lattice during the growth. The multi-layered HT-AlN/LT-AlN/HT-AlN structure solves the first problem. A grading composition $Al_{1-x}Ga_xN$ buffer layer (0<x<1) solves the second problem, by adjusting the X value with the deposition thickness. According to the above-cited formulas, the lattice mismatch between GaN and a $Al_{1-x}Ga_xN$ buffer layer can be changed from 2.5% to 0 by adjustment of the X value in the grading layer from 0 to 1, to obtain a compressive value.

5. GaN is grown on a fixed composition $Al_{1-x}Ga_xN$ buffer layer (0<x<1), to obtain a high quality epi GaN films on a Si substrate. The GaN layer has a thickness of about 500-30000 nm, and is deposited at 1000-1200° C., with III/V ratio from 500 to 4000, depending upon the MOCVD system.

6. If the thickness and film quality of the GaN film is insufficient, Steps 3-5 of the above-mentioned process may be repeated to further improve the film quality and grow thicker epi GaN films, as shown in FIG. 4.

7. If the thickness and film quality of the GaN films is still insufficient, a nanoheteroepitaxy lateral overgrowth technology may be combined with the Al compound buffer layers to make high quality thick GaN films on Si substrates using AAO or block copolymer lithography, as shown in FIG. 5.

$Al_2O_3$ can be coated on Si substrates by anodized alumina oxide (AAO) processes. An AAO process may, for example, deposit a high quality aluminum film on a silicon substrate using E-beam evaporation, with a film thickness of 0.5 to 1.5 μm. Both oxalic and sulfuric acid may be used in the anodization process. In a first step, the aluminum coated wafers are immersed in acid solution at 0° C. for 5 to 10 minutes for an anodization treatment. Then, the alumina formed in the first anodic step is removed by immersion in a mixture of $H_3PO_4$ (4-16 wt %) and $H_2Cr_2O_4$ (2-10 wt %) for 10 to 20 minutes. After cleaning the wafer surface, the aluminum film is exposed to a second anodic treatment, the same as the first step described above. Then, the aluminum film may be treated in 2-8 wt % $H_3PO_4$ aqueous solution for 15 to 90 minutes. The processes may be used to form a porous alumina template, if desired.

FIG. 6 is a flowchart illustrating a method for forming a thermal expansion interface between Si and GaN films using multiple buffer layers of aluminum compounds.

Step 1002 provides a (111) Si substrate. Prior to forming the first layer of first film overlying the Si substrate, a Si substrate top surface may be optionally cleaned using an in-situ hydrogen treatment. Step 1004 deposits a first layer of AlN overlying the substrate, heating the substrate to a temperature within a first range. Step 1006 deposits a second layer of AlN overlying the first layer of AlN, heating the substrate to a temperature within a second range, lower than the first range. Step 1008 deposits a third layer of AlN overlying the second layer of AlN, heating the substrate to a temperature within the first range. Step 1010 forms a first grading $Al_{1-x}Ga_xN$ layer overlying the third layer of AlN, where 0<X<1. Step 1012 forms a first fixed composition $Al_{1-x}Ga_xN$ layer overlying the first grading $Al_{1-x}Ga_xN$ layer, where 0<X<1. Step 1014 grows a first epitaxial GaN layer overlying the fixed composition $Al_{1-x}Ga_xN$ layer.

In one aspect, depositing the first and third AlN layers in Step 1004 and 1008 includes depositing AlN at a temperature within a first range of 1000 to 1200° C. Depositing the second AlN layer in Step 1006 includes depositing AlN at a temperature within a second range of 500 to 800° C. Forming the first grading and first fixed composition $Al_{1-x}Ga_xN$ layers in Steps 1010 and 1012 includes depositing each $Al_{1-x}Ga_xN$ layer at a substrate temperature within the first range. Growing the first epitaxial GaN layer in Step 1014 includes depositing the GaN layer at a substrate temperature within the first range.

In another aspect, depositing the first, second, and third AlN layers in Step 1004, 1006, and 1008 includes introducing Al (III) and N (IV) precursors in a chemical vapor deposition (CVD) process having a III to IV mole ratio in a range of 500 to 4000. For example, if a ratio of 500 is used, there is 1 mole of Al for every 500 moles of N. Forming the first grading and first fixed composition $Al_{1-x}Ga_xN$ layers in Steps 1010 and 1012 includes forming each $Al_{1-x}Ga_xN$ layer by introducing Ga (III) and Al (III), and N (IV) precursors in a CVD process having a III to IV mole ratio in a range of 500 to 4000. Growing the first epitaxial GaN layer in Step 1014 includes forming a GaN layer by introducing Ga (III) and N (IV) precursors in a CVD process having a III to IV mole ratio in a range of 500 to 4000.

In a different aspect, depositing the first and second AlN layers in Step 1004 and 1006 includes depositing each AlN layer to a thickness in a range of 10 to 50 nanometers (nm). Depositing the third AlN layer in Step 1008 includes depositing AlN to a thickness in a range of 100 to 500 nm. Forming the first grading and first fixed composition $Al_{1-x}Ga_xN$ layers in Steps 1010 and 1012 includes forming each $Al_{1-x}Ga_xN$ layer having a thickness in a range of 10 to 500 nm. Growing the first epitaxial GaN layer in Step 1014 includes forming a GaN layer having a thickness in a range of 500 to 3000 nm.

In one aspect, subsequent to growing the first epitaxial GaN layer in Step 1014, Step 1016 forms a second grading $Al_{1-x}Ga_xN$ layer overlying the first epitaxial GaN layer. Step 1018 forms a second fixed composition $Al_{1-x}Ga_xN$ layer overlying the second grading $Al_{1-x}Ga_xN$ layer. Step 1020 grows a second epitaxial GaN layer overlying the fixed composition $Al_{1-x}Ga_xN$ layer.

In a related aspect, Step 1022 forms a patterned layer overlying the second epitaxial GaN layer, which may be AAO or block polymer. Using a lateral nanoheteroepitaxy overgrowth (LNEO) process, Step 1024 grows a GaN layer overlying the patterned layer. For example, forming a patterned layer of AAO in Step 1022 may include using a film material such as AlN, an AlN/grading AlGaN ($Al_{1-x}Ga_xN$ (0<X<1)) stack, an AlN/AlGaN/GaN stack, or Al. In one aspect, the patterned layer has a thickness in a range of 10 to 500 nm, pattern openings with a diameter in a range between 5 and 100 nm, a depth extending through the patterned layer thickness, and a distance between openings in the range between 100 nm and 2 micrometers (μm).

A GaN-on-Si thermal expansion interface using multiple layers of Al compound buffer layers has been provided along with an associated fabrication process. Some examples and materials, dimensions, and process steps have been given to illustrate the invention. However, the invention is not limited to merely these examples. For example, AlN has been used as an example of an Al compound buffer film. However, the invention is feasible using other Al compounds for the buffer layers. Other variations and embodiments of the invention will occur to those skilled in the art.

We claim:

1. A method for forming a thermal expansion interface between silicon (Si) and gallium nitride (GaN) films using multiple buffer layers of aluminum compounds, the method comprising:

providing a (111) Si substrate;

depositing a first layer of AlN overlying the substrate, heating the substrate to a temperature within a first range;

depositing a second layer of AlN directly overlying and in contact with the first layer of AlN, hearing the substrate to a temperature within a second range, lower than the first range;

depositing a third layer of AlN directly overlying and in contact with the second layer of AlN, heating the substrate to a temperature within the first range;

forming a first grading $Al_{1-x}Ga_xN$ layer directly overlying and in contact with the third layer of AlN, where 0<X<1;

forming a first fixed composition $Al_{1-x}Ga_xN$ layer directly overlying and in contact with the first grading $Al_{1-x}Ga_xN$ layer, where 0<X<1; and, growing a first epitaxial GaN layer directly overlying and in contact with the fixed composition $Al_{1-x}Ga_xN$ layer.

2. The method of claim 1 wherein depositing the first and third AlN layers includes depositing AlN at a temperature within a first range of 1000 to 1200° C.

3. The method of claim 2 wherein forming the first grading and first fixed composition $Al_{1-x}Ga_xN$ layers includes depositing each $Al_{1-x}Ga_xN$ layer at a substrate temperature within the first range.

4. The method of claim 2 wherein growing the first epitaxial GaN layer includes depositing the GaN layer at a substrate temperature within the first range.

5. The method of claim 1 wherein depositing the second AlN layer includes depositing AlN at a temperature within a second range of 500 to 800° C.

6. The method of claim 1 wherein depositing the first, second, and third AlN layers includes introducing Al (III) and N (IV) precursors in a chemical vapor deposition (CVD) process having a III to IV mole ratio in a range of 500 to 4000.

7. The method of claim 1 wherein depositing the first and second AlN layers includes depositing each AlN layer to a thickness in a range of 10 to 50 nanometers (nm).

8. The method of claim 1 wherein depositing the third AlN layer includes depositing AlN to a thickness in a range of 100 to 500 nm.

9. The method of claim 1 wherein forming the first grading and first fixed composition $Al_{1-x}Ga_xN$ layers includes forming each $Al_{1-x}Ga_xN$ layer having a thickness in a range of 10 to 500 nm.

10. The method of claim 1 wherein forming the first grading and first fixed composition $Al_{1-x}Ga_xN$ layers includes forming each $Al_{1-x}Ga_xN$ layer by introducing Ga (III) and Al (III), and N (IV) precursors in a CVD process having a III to IV mole ratio in a range of 500 to 4000.

11. The method of claim 1 wherein growing the first epitaxial GaN layer includes forming a GaN layer having a thickness in a range of 500 to 3000 nm.

12. The method of claim 1 wherein growing the first epitaxial GaN layer includes forming a GaN layer by introducing Ga (III) and N (IV) precursors in a CVD process having a III to IV mole ratio in a range of 500 to 4000.

13. The method of claim 1 further comprising:
subsequent to growing the first epitaxial GaN layer, forming a second grading $Al_{1-x}Ga_xN$ layer overlying the first epitaxial GaN layer, forming a second fixed composition $Al_{1-x}Ga_xN$ layer overlying the second grading $Al_{1-x}Ga_xN$ layer, and growing a second epitaxial GaN layer overlying the fixed composition $Al_{1-x}Ga_xN$ layer.

14. The method of claim 13 further comprising:
forming a patterned layer overlying the second epitaxial GaN layer, selected from a group consisting of anodized aluminum oxide (AAO) and block polymer; and,
using a lateral nanoheteroepitaxy overgrowth (LNEO) process, growing a GaN layer overlying the patterned layer.

15. The method of claim 14 wherein forming the patterned layer of AAO includes using a film material selected from a group consisting of AlN, an AlN/grading AlGaN ($Al_{1-x}Ga_xN$ (0<X<1)) stack, an AlN/AlGaN/GaN stack, and Al.

16. The method of claim 14 wherein forming the patterned layer includes forming a layer having a thickness in a range of 10 to 500 nm, and pattern openings having a diameter in a range between 5 and 100 nm, a depth extending through the patterned layer thickness, and a distance between openings in a range between 100 nm and 2 micrometers (μm).

* * * * *

UNITED STATES PATENT AND TRADEMARK OFFICE
CERTIFICATE OF CORRECTION

PATENT NO. : 7,598,108 B2 Page 1 of 1
APPLICATION NO. : 11/825427
DATED : October 6, 2009
INVENTOR(S) : Tingkai Li et al.

It is certified that error appears in the above-identified patent and that said Letters Patent is hereby corrected as shown below:

Column 8, line 44,

Claim 1 should read as follows:

1. A method for forming a thermal expansion interface between silicon (Si) and gallium nitride (GaN) films using multiple buffer layers of aluminum compounds, the method comprising:
    providing a (111) Si substrate;
    depositing a first layer of AlN overlying the substrate, heating the substrate to a temperature within a first range;
    depositing a second layer of AlN directly overlying and in contact with the first layer of AlN, heating the substrate to a temperature within a second range, lower than the first range;
    depositing a third layer of AlN directly overlying and in contact with the second layer of AlN, heating the substrate to a temperature within the first range;
    forming a first grading $Al_{1-X}Ga_XN$ layer directly overlying and in contact with the third layer of AlN, where $0 < X < 1$;
    forming a first fixed composition $Al_{1-X}Ga_XN$ layer directly overlying and in contact with the first grading $Al_{1-X}Ga_XN$ layer, where $0 < X < 1$; and,
    growing a first epitaxial GaN layer directly overlying and in contact with the fixed composition $Al_{1-X}Ga_XN$ layer.

Signed and Sealed this

Seventeenth Day of November, 2009

David J. Kappos
*Director of the United States Patent and Trademark Office*